US005659155A

United States Patent [19]

Porzilli

[11] Patent Number: 5,659,155

[45] Date of Patent: Aug. 19, 1997

[54] ACOUSTICAL TRANSDUCER ENCLOSURE

[76] Inventor: Louis B. Porzilli, 164 W. Shore Trail, Sparta, N.J. 07871

[21] Appl. No.: 503,980

[22] Filed: Jul. 19, 1995

Related U.S. Application Data

[63] Continuation of Ser. No. 146,786, Nov. 2, 1993, abandoned, which is a continuation-in-part of Ser. No. 801,381, Dec. 2, 1991, Pat. No. 5,327,985.

[51] Int. Cl.[6] .............................. H05K 5/00; H04R 1/02

[52] U.S. Cl. .............................. 181/0.5; 181/144; 181/148; 181/184; 181/189; 181/199; 381/88; 381/90; 381/155; 381/159

[58] Field of Search .............................. 181/144, 148, 181/206, 184, 199, 189, 0.5; 381/88, 90, 153, 155, 159

[56] References Cited

U.S. PATENT DOCUMENTS 4,169,516 10/1979 Honda .............................. 181/153
4,201,274 5/1980 Carlton .............................. 181/156
4,805,729 2/1989 Wascom .............................. 181/144
5,012,889 5/1991 Rodgers .............................. 181/152
5,111,905 5/1992 Rodgers .............................. 181/152
5,115,473 5/1992 Yamagishi et al. .............................. 381/154

*Primary Examiner*—J. Woodrow Eldred
*Attorney, Agent, or Firm*—William Squire

[57] ABSTRACT

The purpose of the invention is to direct, in a coherent fashion, audible frequencies, particularly, low frequencies and especially those below 90 cycles. The advantage to directing low frequencies to acute projection patterns previously thought impossible is to reduce low frequency feedback in live performance applications and to reduce low frequency room reverberation in all applications which results in a faster decay time of the low frequency produced. Acute directivity of low frequencies is achieved by using a rectangular enclosure in the vertical axis and by placing a rectangular port on the horizontal axis centrally located between two transducers. The three-point projection pattern is established so that the three points of projection can act to set up a carrier wave and side band waves effect. Alternatively, one transducer can be centrally located between two rectangular ports.

16 Claims, 3 Drawing Sheets

ACOUSTICAL TRANSDUCER ENCLOSURE

FIELD OF THE INVENTION

This application is a continuation of U.S. patent application Ser. No. 08/146,786, filed Nov. 2, 1993, now abandoned, which is a continuation-in-part of U.S. patent application Ser. No. 07/801,381 filed Dec. 2, 1991, now U.S. Pat. No. 5,327,985.

This invention relates to an acoustical transducer enclosure which boosts and directs sound waves, particularly those under 90 cycles, to provide optimum bass control.

BACKGROUND OF THE INVENTION

Commercial sound systems for concerts are expected to obtain a quality substantially beyond home systems and are therefore extremely high priced. One problem which continues, despite the high price, is low frequency degradation and low frequency reverberation in confined spaces due to dispersion, especially in the bass waves which can directly result in low frequency feedback.

Bass waves are extremely inefficient and are subject to the greatest loss and dispersion in comparison to mid- and high-range frequencies.

A significant limitation of the current state of the art acoustic transducers has been their frequency dependent beamwidth. The beamwidth of compression drivers, as well as more conventional transducers, is a function of both the size of the vibrating element and the transducer size, in the case of conventional transducers, or the exit dimension and the frequency of vibration, in the case of compression drivers. Compression drivers make use of an acoustic impedance matching device in the shape of a horn attached to the exit of the driver. This device partially controls the beamwidth as well as improves efficiency. Although this solution greatly improves efficiency, it only partially resolves the beamwidth frequency dependence. Other compression drivers attempt to reduce frequency dependence by resorting to very small compression driver exits, however, this reduces transducer efficiency.

Recently, a transducer system appeared in the state of the art which controls beamwidth dependence through use of an enclosure which is shaped as the envelope of ellipsoids. The enclosure has radially oriented distinct focal points as well as a common focal point. Transducers placed at the distinct focal points will have their acoustic radiation focused at the common focal point and, provided that the ellipsoids have essentially identical path lengths from distinct focal point to ellipsoid to common focal point, their acoustic energy will be coupled in phase. Further, the beamwidth of this device is wide and essentially frequency independent. The device, however, displays a radial interference pattern when the acoustic radiation of the transducers, located on the radially distributed distinct focal points, interact. Specifically, transducers on neighboring distinct focal points can destructively interfere with each other, thereby causing radial diffraction or combing in the acoustic radiation field.

Another transducer system which has appeared in the state of the art overcomes the radial interference problem by use of an acoustic reflective lens. The lens shape is produced when a section of an ellipse is revolved about a line which passes through one of the focal points of the ellipse at some finite angle with respect to the ellipse major axis. In one embodiment, the lens is shaped like that of a cone, the sides of which are concave and describe a continuum of sections of identical ellipses one focal point, common to all the ellipses, is positioned directly above the apex of the cone while the other focal points of the ellipses describe a circle around the base of the cone. A transducer placed at the common focal point, facing the apex, will have its radiation reflected from the cone surface and, owing to the elliptical shape of the sides of the cones, focused coherently onto the focal circle referred to above. The focal circle will appear as a virtual source of coherent acoustical radiation which, due to the symmetry of the cone, will emanate equally from the base of the cone. The beamwidth of acoustical radiation perpendicular to the base of the cone is controlled by the elliptical-shape of the sides of the cone. Two such cones, with accompanying transducers, may be placed base-to-base in order to produce a radiation pattern whose horizontal beamwidth is 360 degrees and whose vertical beamwidth is frequency invariant.

A limitation of this reflective lens exists that is due to the use of the elliptical geometry. This geometry constrains radiation to emanate, or appear to emanate, from the common focal point of the acoustic lens in order to be coherently focused onto the focal circle. Currently available transducers do not produce such radiation and thus the radiation pattern from this acoustically reflective lens will be somewhat incoherent and may exhibit interference due to this constraint.

U.S. Pat. No. 4,836,328 to Ferralli provides a geometrically-shaped reflective lens for a transduction element such that all acoustic path lengths from the transduction element surface to the lens focal element are substantially identical. A geometrically shaped reflective lens is also provided, which will focus acoustic waves produced by the transduction element to a focal element which is characteristic of the lens, as well as increase the beamwidth of the acoustic radiation emanating from the lens and provide for the relative consistency of the beamwidth as a function of acoustic wave frequency. The Ferralli patent utilizes a multiple transducer and an elliptical shaped backbox. The transducer cone is placed forward into the apex of the ellipsoid and is subject to combined filtering. The Ferralli Patent also does not provide a complex baffling and wave guide system.

This Patent discloses multiple transducers and places the transducer cone forward into the apex of the ellipsoid and is subject to comb filtering. This Patent does not disclose a complex baffling and wave guide system and has not been tested free field.

None of the prior art patents have, however, overcome the problem of diverse bass waves. The instant invention can be produced with the elliptical shaped backbox which is a common design, however, all the other known complex baffling and wave guides must be employed in order to achieve directionality under 90 cycles. The increased directionality provided by the device according to the present invention promotes cleaner sound with less room reverberation and low frequency feedback than omni-directional oriented bass enclosure designs due to the popular theoretical misconception that bass waves cannot be made directional under 90 cycles.

SUMMARY OF THE INVENTION

The present invention relates to an acoustical transducer enclosure which is particularly adapted for directing sound waves and is a multi-sided enclosure. In the first embodiment, FIG. 1, the enclosure has a cylindrical hollow tube, held in position at multiple points within the back box, with a transducer housed within the cylinder. Forward plane wave guides line the interior area of the enclosure. Wave form vents are located on a horizontal plane, with the enclosure in the vertical orientation as shown in FIG. 1, with the transducer at one end of the cylindrical hollow tube. A rear back pressure booster baffle is located at the end of cylindrical hollow tube with a wave splitter which is located proximate the rear back pressure booster baffle.

In a more easily manufactured version, conventional construction techniques are applied to utilize some of the same aspects as represented in FIG. 1 and its reverse.

In the embodiment of FIG. 2, the rear wave is controlled by two horizontal ports equidistantly spaced in relationship to the transducer with the enclosure vertical (or in the reverse configuration by two transducers and a central port). The face plate from which the ports are cut and on which the transducer is mounted can be recessed so that the surfaces forward of the face mounting plate act to guide waves released from the enclosure. Further, wave plane surfaces are created by support struts mounted behind and along the periphery of the ports. The concept of equidistant spacing of the ports and transducer, each being centered on the face plate and three-point projection of the generated waves in a region forward of the face plate is critical to controlling low frequencies. The addition of forward plane serrated and frequency tuned wave guides serves to further enhance wave directivity. In the embodiment of FIG. 3, the concept of the point equidistant spacing is represented by reversing .the number of ports to transducers relationship. Wave plane surfaces are formed by port support struts when the face plate is recessed and the support struts are mounted behind and along the periphery of the port. These wave planes are critical as represented in FIGS. 4 and 5 and further, frequency tuned serrated wave guides can then preferably be mounted along all forward planes of the port(s) and forward planes created by recessing the face mounting plate.

BRIEF DESCRIPTION OF THE DRAWINGS

The objectives and advantages of the instant invention will become apparent when the specification is read in conjunction with the drawings, wherein.

In all of the drawings, a three-point equidistant spacing of the port(s) and transducer(s) and the resulting three-point projection of the generated waves forward of the enclosure from the transducer(s) and port(s) allows for a carrier wave with side-bands to enhance low frequency projection when reproduced. The three-point projected waves are further enhanced in both the more complex FIG. 1 and FIGS. 2 through 5 by the introduction of frequency tuned wave guides on certain wave control planes of the enclosure and ports.

DESCRIPTION OF THE PREFERRED EMBODIMENT

Figure 1:
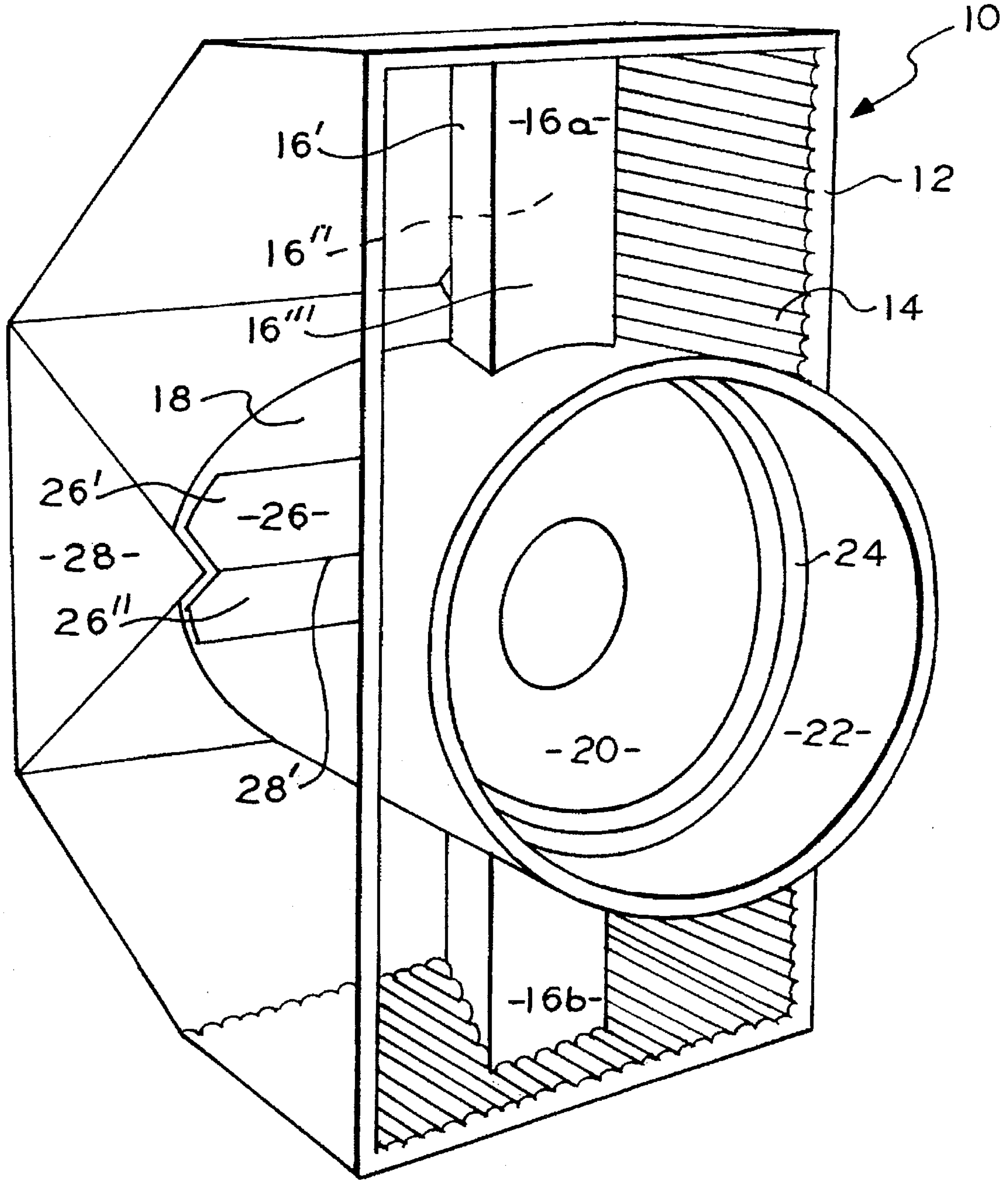
FIG. 1 is a cutaway perspective view of the acoustical enclosure system of one embodiment of the present invention.

FIG. 1 illustrates the speaker 10 with the sides cut away to reveal the interior of enclosure 12. The enclosure 12 can be built from any dense material, however, the core of the speaker enclosure 12 construction must be dense in order to be reflective on all internal surfaces or secondarily have the ability to capture and stop a base wave by preventing stray non directional waves. Insulation is not needed within the enclosure 12 as the various waveguides and baffles serve to direct and boost dBSPL (decibels measured in sound pressure level) performance and overall directionality, as well as direct through reflection the waves in the desired direction.

The design of the instant device provides a higher degree of directionality under 90 cycles than conventional enclosure designs. As the cycle frequency increases, so does the directionality since the higher the frequency, the greater the directionality, with the lower frequencies being more difficult to direct. Homosote™, a material using paper dust and glue made into boards, is an example of a lightweight material which meets the criteria for building the interior or core of the enclosure 12. The exterior of the enclosure 12 can be covered with any durable material which will not crack or chip under abusive road use. The forward plane wave guides 14 are used to line the interior forward planes of the enclosure 12 and direct or channel the waves to attain a high degree of directionality before final release from the enclosure 12 as wave projections. The forward plane waveguides 14 can be varied in height, width, and separation to control by capturing, i.e., directing, the various bass frequencies and/or their respective harmonics. In FIG. 1, the forward baffles 16*a* and 16*b* have side walls 16' and 16" inclined relative to the front wall 16$^{111}$ and are used to push the back wave into the forward plane waveguides 14 to heighten the directivity of all frequencies and increases dBSPL performance. The forward guides 14 are further particularly useful in directing waves of low frequencies. The rear back pressure booster baffle 18, located behind the driver transducer 20, is used to form or shape the back wave and boost dBSPL.

The tubular forward wave guide 22 houses or contains the driver transducer 20 and is mounted within the side walls of the forward wave guide 22. With dynamic simulation programs, tubular, square and other geometric shapes and configurations can be used to heighten, i.e., increase, wave directivity of the enclosure characteristics. The connection between the tubular forward wave guide 22 and the top forward baffle 16*a* and the bottom forward baffle 16*b* must be secure to prevent vibration of the forward wave guide 22. The driver transducer 20 is mounted within the forward wave guide 22 through use of a round L-shaped aluminum mounting ring 24. The speaker driver transducer 20 is mounted flush against the raised portion of the L-ring 24 and must be removable to allow for repairs. The removal of the speaker driver transducer 20 can be through a slide out system, hinge or any other applicable structure as known in the prior art. By changing the distance between the rear back pressure booster baffle 18 and the driver of transducer 20, tuning is possible.

The rear wave form vent 26, located directly behind the driver transducer 20, determines the release of sound pressure. The rear wave form vent 26 directly corresponds to the size of the rear back pressure booster baffle 18 to increase dBSPL and direct the back wave by pre-forming the back-wave before it reaches the forward plane waveguides 14.

Figure 3:
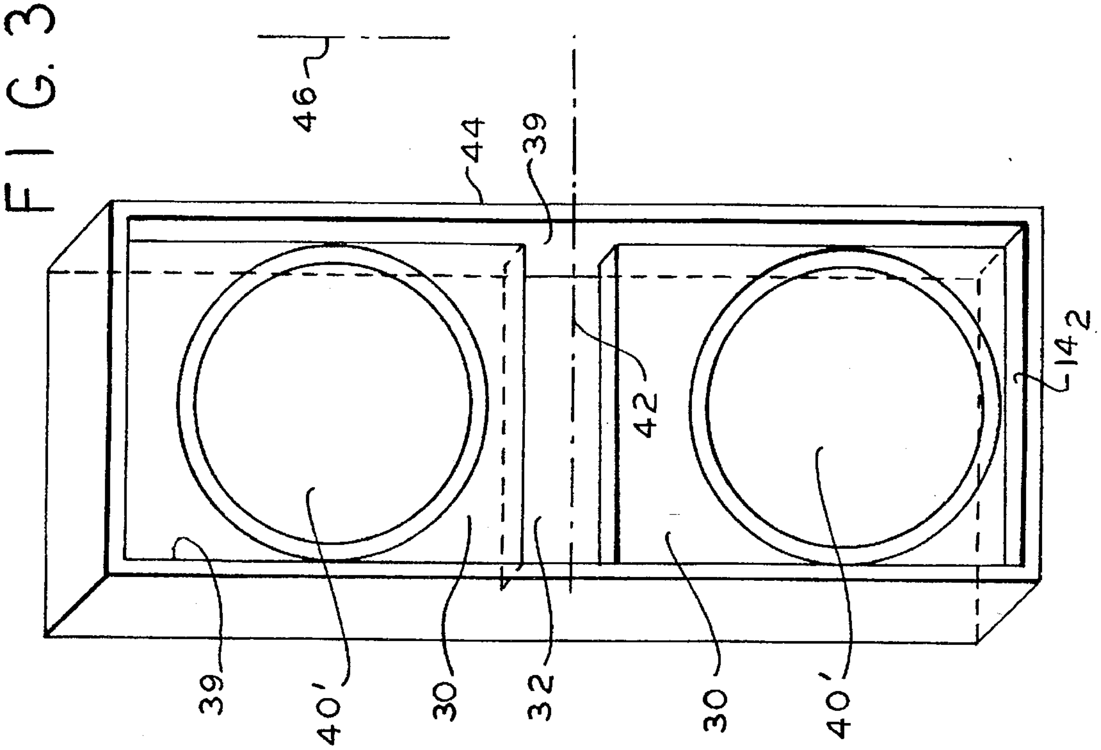
FIG. 3 is an exterior three-dimensional view of a conventional reverse interpretation of the acoustical enclosure employing a conventional external enclosure housing and internally a third embodiment of the present invention which is the reverse of the embodiment of FIG. 2.
Figure 2:
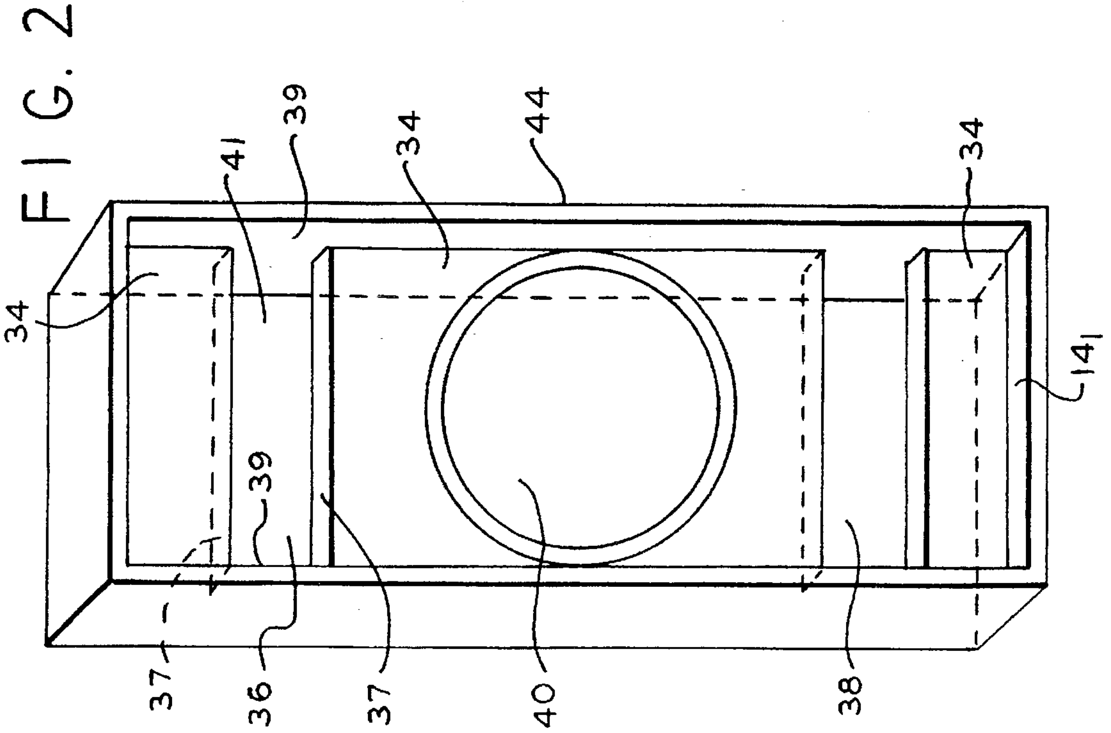
FIG. 2 is an exterior three-dimensional view of a conventional interpretation of the acoustical enclosure employing a conventional external enclosure housing and. internally a second embodiment of the present invention.
Figure 5:
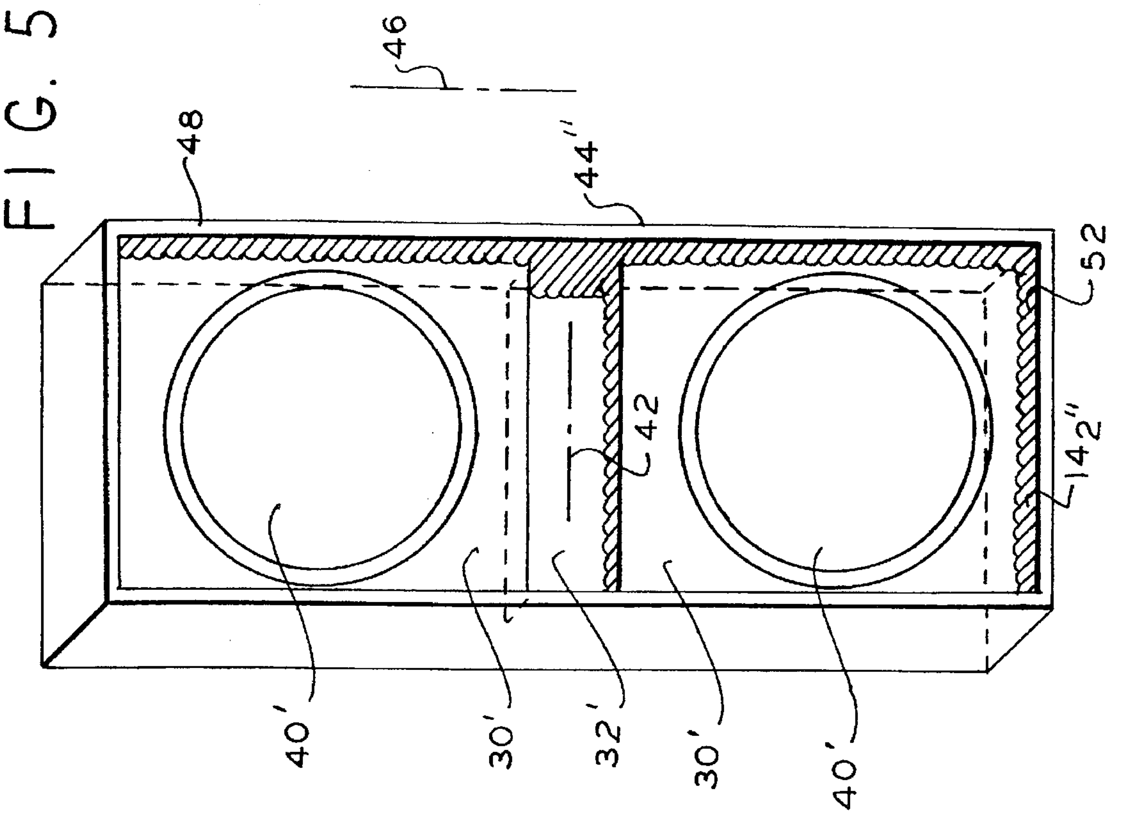
FIG. 5 is an exterior three-dimensional view of the conventional reverse interpretation of FIG. 3 with frequency tuned forward plane wave guides in the acoustical enclosure.
Figure 4:
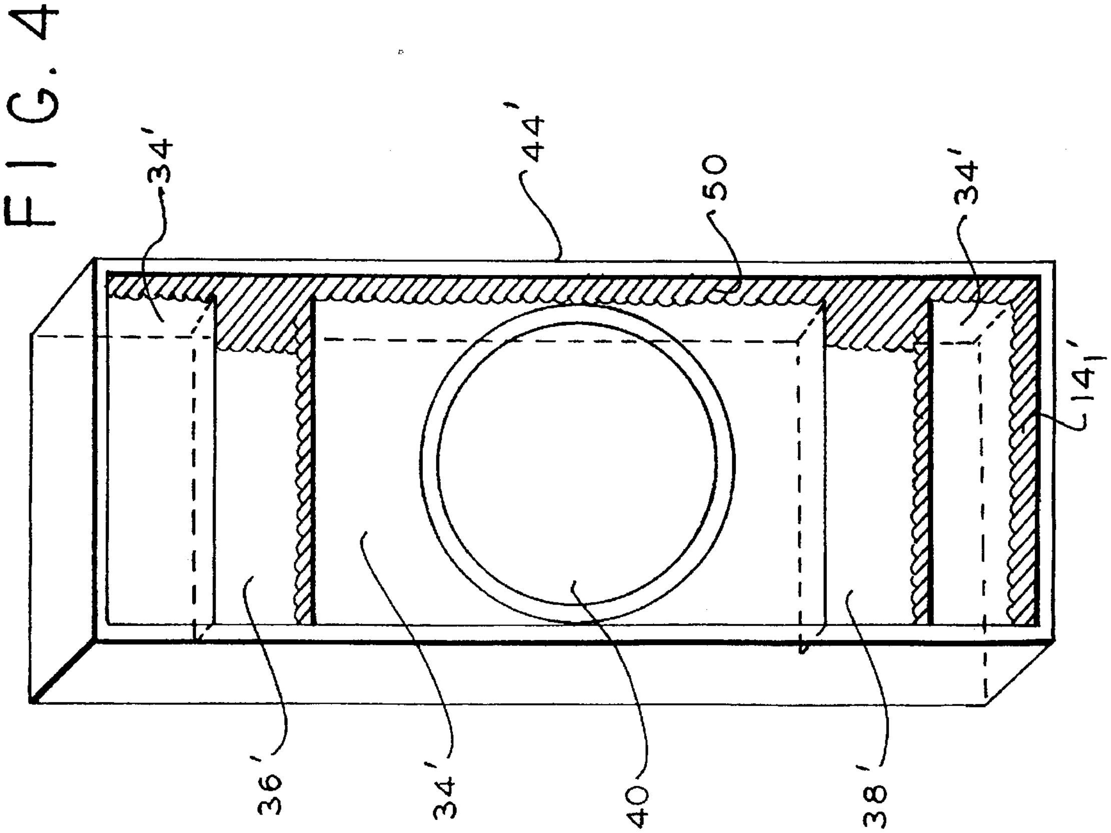
FIG. 4 is an exterior three-dimensional view of the conventional interpretation of FIG. 2 with frequency tuned forward plane wave guides in the acoustical enclosure.

In FIGS. 3 and 5, the approximate combined area of the vent 26, FIG. 1, is brought directly forward and situated in the respective face plates 30, 30' as ports 32, 32' when building the conventional reverse versions. In FIGS. 2 and 4, the vent 26 areas of FIG. 1 forming the rear wave form vents 26 portions 26' and 26" are separated and brought forward to the respective face plates 34, 34' and configured so a three-point low frequency wave projection is achieved forward the respective enclosures 44 and 44' in the conventional interpretation.

In FIGS. 2 and 4, the respective ports 36, 38 (FIG. 2) and ports 36', 38' (FIG. 4) comprise front facing areas corresponding to the areas presented by vent 26, FIG. 1. The vent 26 comprises two adjacent vent portions 26' and 26" open to the enclosure space to the rear of transducer 20 and are separated by the apex 28' of the wave splitter 28. The ports 36, 38 (or 36', 38') (FIGS. 2 and 4) correspond to vent portions 26' and 26" brought forward. The ports 36, 38 (FIG. 2) and 36', 38' (FIG. 4) with the transducer 40 form a three-point waveform projection in front of the corresponding respective face plates 34, 34', the ports and transducer each corresponding to a different point of the projection.

Representative port 36, FIG. 2, is formed by planar horizontal rectangular support struts 37 forming the aforementioned horizontal wave control planes and the vertical interior plane surfaces 39 of the vertical sides of the enclosure 44 forming vertical wave control planes of the port.

Port 36 is a longitudinally extending rectangular opening on horizontal axis 42 open to and in wave communication with the space to the rear of the transducer 40, FIG. 2. The space 41 to the rear of port 36 is formed by wave control plane surfaces of the housing enclosure 44 and is rectangular. The space forward of the face plate 34 is formed by the forward planar wave plane surfaces 14, of the enclosure and is rectangular. The space 41, the ports 36 and 38 and the forward wave plane surfaces 14, all have common interior wave control surfaces 39 of the enclosure 44.

It is these common surfaces 39 and the rectangular shape, position and orientation of the spaces which cooperate to provide enhanced directivity to the resultant low frequency waves, i.e., below 90 Hz, emanating from the enclosure 44. All of the embodiments in the various Figures have common enclosure side wall surfaces, rectangular horizontal ports and rectangular forward wave control planes. The single transducer of FIGS. 2 and 4 and the respective ports 36, 38 or 36', 38' are equidistant from each other forming the three point equidistant spacing referred to hereinabove. The transducer 40 and the ports 36 and 38 form the three points. This structure produces the referred to three point projection wherein the waves at the front of the enclosure have a carrier wave formed by the transducer 40 (one point) and side band waves (two points) formed by the waveforms emanating from the two ports 36 and 38. The resultant waves emanating from the two ports and the transducer is highly directional at the lower frequencies.

The embodiments of FIGS. 3 and 5 are the reverse of FIGS. 2 and 4. In FIGS. 3 and 5, the two transducers 40' form two points of the wave form projection and the respective central ports 32, 32' form the third point.

In FIGS. 3 and 5, the approximate combined area of vent 26 rear wave form vent portions 26' and 26" is brought directly forward and situated in the center of the face plate 30 on a horizontal axis 42 with the enclosure 44 in the vertical orientation, axis 46, when constructing the conventional reverse. This results in a reversal of the port to transducer relationships, yet maintains the three-point equidistant spacing of the port and transducers. In FIGS. 4 and 5 of the conventional and conventional reverse interpretations, the respective forward planes 50 and 52 and ports 36', 38' and 32' are lined with corrugated types of surfaces of respective frequency tuned wave guides $\mathbf{14_1}$', $\mathbf{14_2}$".

In FIG. 1, the wave splitter 28 splits the back wave at respective vent portions 21' and 26" and assists in preforming the wave as well as assisting in boosting the dBSPL performance. The back wave is split to pre-form the wave through the wave splitter 28 and is then boosted, through use of the rear back pressure booster baffle 18 and rear wave form vent 26. The rear wave form vent 26 allows release of all frequencies and pre-forms the wave. The forward plane wave guides 14 finely or, more specifically, pre-forms the waveforms to specific frequencies and their respective harmonics. The forward baffles **16*a* and 16*b* assist in directing the waveform by pushing or contouring the back wave into forward plane wave guides 14. The forward baffles 16*a* and 16*b* also boost dBSPL and allow for a more directed release through contouring of the back wave into the forward plane wave guides 14**.

All of the internal waved exposed surfaces of the speaker 10 are solid and reflective to provide the maximum efficiency in the bass frequencies. The size can be varied, however, it is critical to keep all parts in proportion to achieve the maximum benefit of the instant disclosure. The design can also be varied to make the enclosures 12, 44, and 44' smaller on the vertical measurement, however, all parts must be kept in proportion. Each type of speaker should be built to best suit the type of music or other source being reproduced thereby. The enclosures 12, 44 and 44' can be constructed for pre-recorded, live or instrumental (bass guitar) or sound enforcement applications as the characteristics of each source are different. The speaker design is based on the lowest common denominator harmonic frequencies, i.e., a design which utilizes and controls the smallest complete usable fragment of a wave and design an enclosure to control and work around those frequencies or their respective harmonics.

By varying the distance of the driver transducer 20 in the forward plane wave guide 14, the enclosure 12 tuning can be changed by up to one full note (or one full step) when using a bass guitar as a sound source. Also, in FIG. 1, when the driver transducer is moved back to front, the resulting ratios involving wave control are varied wherein the transducer(s) and port(s) interact to affect the three-point equidistantly-spaced carrier and side band wave(s) projection relationships and thus affect cumulative wave directivity and performance.

It is here in FIG. 1 that the central concept, as previously contemplated by the inventor, is best exemplified. It is the interaction created by the three-point equidistantly spaced areas of projection permitted by the port(s) to transducer(s) relationship which allow for a carrier and side band relationship to exist, hence heightening directivity within lower frequencies with minimal cancellation.

This concept is further demonstrated in FIGS. 2, 3, 4 and 5 which illustrate the conventional form of enclosure construction with the concepts found in FIG. 1 applied.

By changing various angles and distances with a dynamic simulation computer program, directionality, dBSPL output and enclosure tuning can be modified to suit a variety of specific acoustic needs.

While the invention has been described in its preferred embodiment, it is to be understood that the words which have been used are words of description rather than limitation and that changes may be made within the purview of the appended claims without departing from the true scope and spirit of the invention in its broader aspects.

What is claimed is:

1. An acoustical transducer enclosure for directing low frequency waves with reduced feedback and reduced low frequency room reverberation comprising:

a. a multisided enclosure oriented vertically with an exterior face plate, said enclosure having a front and opposing walls forming interior wave control planes; and b. two transducer means located in the face plate; said face plate having a rectangular port between the transducer means in communication with the interior of the multisided enclosure, said port having a horizontal longitudinal length dimension and a plurality of wave control planes;

said transducer means and said port being in the same plane of the face plate to create a three-point projection pattern of respective carrier waves and side band waves of said low frequency waves, said face plate, transducer means and port being recessed in the enclosure from the front to form a forward rectangular box with a plurality of wave control planes which cooperate with said wave control planes of said port and of said enclosure to produce heightened wave directivity of said low frequency waves, the resultant wave directivity providing channel separation for stereo bass reproduction.

2. An acoustical transducer enclosure for directing low frequency waves with reduced feedback and reduced low frequency room reverberation comprising:

a. a multisided enclosure with an exterior face plate lying in a plane; and b. two transducer means located in the face plate said face plate having a rectangular port in communication with the interior of the multisided enclosure;

said transducer means and said port being in the plane of the face plate to create a three-point projection pattern of carrier waves and side band waves to heighten coherent wave directivity of said low frequency waves wherein the face plate, the two transducer means and the port are recessed in the enclosure forming a rectangular recessed box with interior walls, thereby forming a plurality of wave control planes and wherein the walls of said recessed box are covered with forward plane wave guides.

3. The acoustical transducer as defined in claim 2 wherein said port is lined with forward plane wave guides.

4. The acoustical transducer enclosure as defined in claim 2 wherein the height, width and separation of said forward plane wave guides enhance directivity.

5. The acoustical transducer enclosure as defined in claim 3 wherein the height, width and separation of said forward wave guides control the frequencies and subsequent harmonics.

6. An acoustical transducer enclosure for directing low frequencies waves with reduced feedback and reduced low frequency room reverberation comprising:

a. a multisided enclosure oriented vertically with an exterior face plate; said enclosure having a front and opposing walls forming interior wave control planes; and b. a transducer means located in the face plate;

said face plate having two rectangular ports on opposing sides of said transducer means in a vertical direction and in communication with the interior of the multisided enclosure, said ports each having a horizontal longitudinal length dimension, each port having a plurality of wave control planes;

said transducer means and said ports being in the same plane of the face plate for creating a three point protection pattern of respective carrier and side band waves of said low frequency waves, said face plate, transducer means and ports being recessed in the enclosure from the enclosure front to form a forward box with a plurality of wave control planes which cooperate with said wave control planes of said ports and of said enclosure to produce heightened directivity of said low frequency waves, the resultant wave directivity providing channel separation for stereo bass reproduction.

7. The acoustical transducer enclosure as defined in claim 6 wherein the walls of said recessed box are covered with forward plane wave guides.

8. The acoustical transducer as defined in claim 7 wherein said port is lined with forward plane wave guides.

9. The acoustical transducer enclosure as defined in claim 7 wherein the height, width and separation of said forward plane wave guides enhance directivity.

10. The acoustical transducer enclosure as defined in claim 7 wherein the height, width and separation of said forward wave guides control the frequencies and subsequent harmonics.

11. The acoustical transducer as defined in claim 1 wherein the depth of the recessed face plate from the enclosure front is set to a value to enhance performance of said low frequency waves.

12. An acoustical transducer enclosure for directing low frequency waves with reduced feedback and reduced low frequency room reverberation comprising:

a. a multisided enclosure having a front and a vertical orientation and including an exterior face plate; and b. a transducer means centrally located in the face plate;

said face plate having two rectangular ports, each port having a length dimension oriented horizontally, said ports being evenly spaced from said centrally located transducer enclosure, said face plate with the transducer and the ports being set at a depth in the enclosure from the enclosure front forming a rectangular recessed box with interior walls creating forward wave control planes, said wave control planes being covered with forward plane wave guides.

13. An acoustical transducer enclosure for directing low frequency waves with reduced feed back and reduced low frequency room reverberation comprising:

a. a multisided enclosure having a front and a vertical orientation and including an exterior face plate; and b. a transducer means located centrally in the face plate;

said face plate having two rectangular ports each having its length dimension horizontal and each port being evenly spaced from the centrally located transducer;

said face plate with the transducer and the ports being set at depth in the enclosure from the enclosure front forming a rectangular recessed box with interior walls creating wave control planes, said wave control planes and ports being lined with forward plane wave guides.

14. An acoustical transducer enclosure for directing low frequency waves with reduced feed back and reduced low frequency room reverberation comprising:

a. a multisided enclosure having a front and a vertical orientation with an exterior face plate;

b. a transducer means located centrally in the face plate;

two rectangular port each having a longitudinal dimension oriented horizontal and evenly spaced from the centrally located transducer, said face plate with the transducer and the ports being set at a depth in the enclosure from the enclosure front forming a rectangular recessed box with interior walls creating wave control planes, said wave control planes and ports being lined with forward plane wave guides, said forward plane wave guides having a given height, width and separation.

15. An acoustical transducer enclosure for directing low frequency waves with reduced feedback and reduced low frequency room reverberation comprising:

a. a multisided enclosure having a front and including an exterior face plate lying in a plane; and b. a transducer means located in the face plate;

said face plate having two rectangular ports in communication with the interior of the multisided enclosure;

said transducer means and said ports being in the same plane of the face plate;

said face plate with the transducer means and the ports being recessed in the enclosure from the enclosure front forming a rectangular recessed box with interior walls creating wave control planes, the walls of said recessed box being covered with forward plane wave guides.

16. An acoustical transducer enclosure for directing low frequency waves with reduced feedback and reduced low frequency room reverberation comprising:

a. a multisided enclosure having a front and including an exterior face plate lying in a plane; and b. two transducer means located in the face plate;

said face plate having a rectangular port intermediate and substantially equally spaced from the transducer means and in communication with the interior of the multisided enclosure;

said transducer means and said port being in the face plate plane;

said face plate with the transducer means and the port being recessed in the enclosure from the enclosure front forming a rectangular recessed box with interior walls creating control planes, the walls of said recessed box being covered with forward plane wave guides.

* * * * *